(12) United States Patent
Lee et al.

(10) Patent No.: US 8,490,505 B2
(45) Date of Patent: Jul. 23, 2013

(54) ROBOT MECHANISM FOR NONDESTRUCTIVE AGING EVALUATION OF CABLE

(75) Inventors: Jae Kyung Lee, Daejeon (KR); Ki Yong Oh, Daejeon (KR); Byung-hak Cho, Daejeon (KR); Joon Young Park, Daejeon (KR); Jong Seog Kim, Daejeon (KR)

(73) Assignee: Korea Electric Power Corporation, Seoul (KR)

( * ) Notice: Subject to any disclaimer, the term of this patent is extended or adjusted under 35 U.S.C. 154(b) by 906 days.

(21) Appl. No.: 12/608,977

(22) Filed: Oct. 29, 2009

(65) Prior Publication Data
US 2010/0145517 A1    Jun. 10, 2010

(30) Foreign Application Priority Data
Oct. 30, 2008    (KR) .................. 10-2008-0106849

(51) Int. Cl.
*G01N 33/00*    (2006.01)
(52) U.S. Cl.
USPC .......................................................... 73/865.8
(58) Field of Classification Search
USPC .......................................................... 73/865.8
See application file for complete search history.

(56) References Cited

U.S. PATENT DOCUMENTS
3,596,286 A * 7/1971 Coliz et al. ................... 346/86
2004/0099062 A1 * 5/2004 Smith et al. .................. 73/801

FOREIGN PATENT DOCUMENTS
JP           405294572 A * 11/1993

* cited by examiner

*Primary Examiner* — David A. Rogers
*Assistant Examiner* — Alex Devito
(74) *Attorney, Agent, or Firm* — McDermott Will & Emery LLP

(57) ABSTRACT

The present disclosure relates to a robot mechanism for nondestructive aging evaluation of a cable. The robot mechanism includes at least two inspection modules, and a coupler disposed between the at least two inspection modules and connected to each of the inspection modules to adjust a separation between the inspection modules. Each of the inspection modules approaches a cable and automatically inspects an aged state of the cable. The robot mechanism automatically measures an aged state of a cable in a nondestructive manner and establishes a database of cable aging, so that normal operation of the cable can be ensured through stable management of the cable by evaluating a replacement time and the aged state of the cable based on the database.

13 Claims, 9 Drawing Sheets

ROBOT MECHANISM FOR NONDESTRUCTIVE AGING EVALUATION OF CABLE

BACKGROUND OF THE INVENTION

1. Field of the Invention

The present invention generally relates to development of machines in the field of mechatronics, such as a robot mechanism for nondestructive aging evaluation of a cable and, more particularly, to a robot mechanism that can automatically measure an aged state of a cable and establish a database based on the evaluation result to evaluate a replacement time.

2. Description of the Related Art

Conventionally, aging of a cable is directly detected by an operator using a portable cable aging tester which employs a personal digital assistant (PDA). However, since the portable cable aging tester is manually operated by the operator for direct measurement of the aged state of the cable, a significant measurement time is required and measured values vary depending on proficiency of the operator as the number of measurement points increases.

Further, when the cable undergoes changes in local shape and hardness due to exposure to the environment for long durations, the measured values can also vary depending on the measurement points for the same cable, such that repetitious measurement at several measurement points for a single cable is required for accurate aging evaluation of the cable.

Currently, these problems make it difficult to commercialize the portable cable aging tester which is a non-destructive aging tester for cables.

Thus, to solve such problems, it is necessary to achieve reduction in measurement time, enhancement of accuracy and efficiency in measurement, establishment of database through evaluation of many measurement points, and the like.

When establishing an evaluation database of cable aging by measuring a number of points on the cable within a short period of time at low cost, all of these procedures must be automatically performed. However, since studies have mainly focused on development of a nondestructive aging evaluation method, development of an automatic inspection method and an inspection method for various specimens is unsatisfactory in the art.

This invention aims at enhancement in measurement accuracy and repetitious characteristics, reduction in operation time, and improvement in operation efficiency of an aging tester by enabling automatic measurement of a variety of cables within a short period of time through application of the aging tester to a transfer robot mechanism.

[Reference Document]

Jong-seuk Kim, "A Study on Evaluation of Cable Aging through Instrumental Indentation Test," Thesis for the Degree of Engineering Doctor, Chungnam University, 2004.

SUMMARY OF THE INVENTION

The present invention is conceived to solve the above problems of the related art, and an aspect of the invention is to provide a robot mechanism that is capable of automatically measuring an aged state of a cable in a nondestructive manner and establishing a database of cable aging, so that normal operation of the cable can be ensured through stable management of the cable by evaluating a replacement time and the aged state of the cable based on the database.

Another aspect of the invention is to provide a robot mechanism for nondestructive aging evaluation of a cable, which can automatically measure an aged state of a cable using a robot, instead of conventional manual measurement by a worker, thereby reducing the number of workers and operation time while improving stability in operation of the mechanism through establishment of a database for cable aging and lifetime expectation.

In accordance with an aspect of the invention, a robot mechanism for nondestructive aging evaluation of a cable includes at least two inspection modules, each approaching a cable and automatically inspecting an aged state of the cable, and a coupler disposed between the at least two inspection modules and connected to each of the inspection modules to adjust a separation between the inspection modules.

Each of the inspection modules may include a body assembled by a fastener, a transfer unit coupled to a lower portion of the body and moving along the cable, and a measurement unit disposed at a center of the lower portion of the body to perform measurement and inspection of a local aged state of the cable.

The transfer unit may include a pair of drive rollers provided to a lower surface of the body to move along an upper surface of the cable, a drive motor connected to the drive rollers to transmit power, and a detection sensor detecting a velocity of the drive rollers to control the drive rollers. Here, each of the drive rollers is provided with a plurality of O-rings, and the detection sensor includes a photo-interrupter for velocity detection and employs a one-turn step control method.

The measurement unit may include a drive motor secured to the lower portion of the body, a rotational shaft connected to an upper portion of the drive motor and driven by transmitted power, a drive gear connected to the rotational shaft to be associated with rotation of the rotational shaft, a driven gear engaging with the drive gear, a cylinder converting the rotation of the rotational shaft into up-down movement, a force sensor provided to a lower portion of the cylinder to measure or control a force generated by the cylinder, an indentation needle provided to a lower surface of the force sensor to contact the cable, and a cylinder guide member disposed at an upper portion of the cylinder to guide the cylinder during the up-down movement of the cylinder. Here, the cylinder guide member includes a body, a pair of through-holes formed in right and left sides of the body, respectively, a guide hole formed in a center of the body, and a pair of stoppers formed on left and right walls of the guide hole facing each other.

The cylinder may be formed at right and left sides thereof with insertion grooves corresponding to the stoppers. Further, the force sensor may be provided at the lower surface thereof with a cable securing member corresponding to the cylinder guide member and secured to the cable by a constant pressure.

The cable securing member may include a body, a pair of through-holes formed in right and left sides of the body, respectively, a recess formed in a center of the body, and a pair of contacts formed on a lower surface of the body and directly secured to an outer surface of the cable. The measurement unit may further include an elastic member between the cylinder guide member and the cable securing member, and an elastic member-guide member integrally formed with the cylinder guide member between the cylinder guide member and the cable securing member to guide the elastic member while allowing up-down movement of the cable securing member.

The coupler may be secured at a predetermined angle to one side of an upper portion of the body and be provided with a coupling guide member which allows adjustment of length thereof depending on a thickness of the cable. Here, the coupling guide member is mounted at 150 degrees relative to the cable. Odd numbers of the transfer units, the measurement units and the couplers adjusting the separation between the inspection modules are arranged at 120 degrees with respect to each other and are simultaneously driven.

BRIEF DESCRIPTION OF THE DRAWINGS

The above and other aspects, features and advantages of the invention will become apparent from the following detailed description of embodiments of the invention given in conjunction with the accompanying drawings, in which.

DETAILED DESCRIPTION OF THE EMBODIMENTS

Exemplary embodiments of the invention will hereinafter be described in detail with reference to the accompanying drawings.

Figure 1:
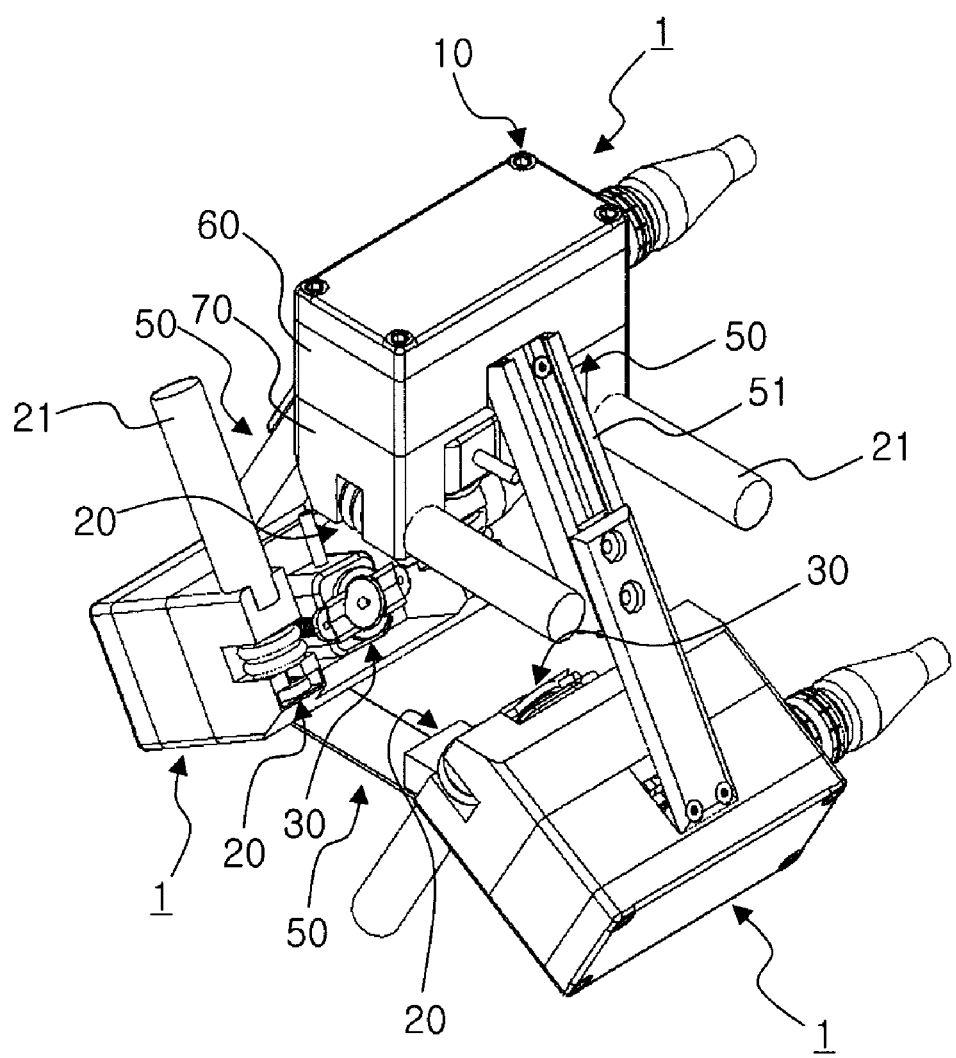
FIGS. 1 and 2 are a perspective view and a plan view showing a coupled relationship of a robot mechanism for nondestructive aging evaluation of a cable in accordance with an embodiment of the present invention.
Figure 2:
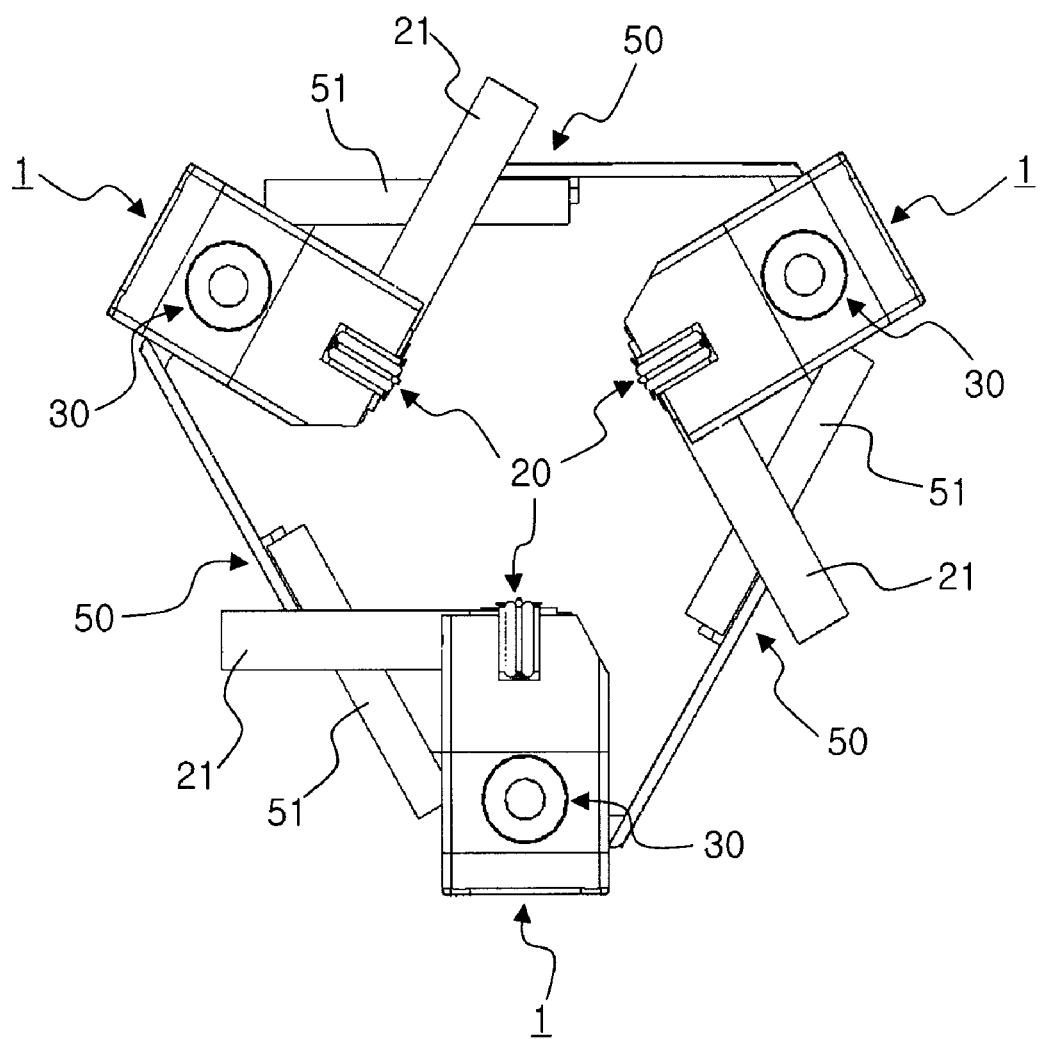

The invention relates to a robot mechanism designed for operation in extreme conditions, which is configured to evaluate aging of a cable due to long term use of the cable or due to various environments such as corrosive gas, ultraviolet radiation, high temperature, and the like. Referring to FIGS. 1 and 2, a robot mechanism for nondestructive aging evaluation of a cable in accordance with an embodiment of the invention includes inspection modules 1 and couplers 50.

The robot mechanism includes at least two inspection modules 1, and the coupler 50 is connected to each of the inspection modules 50 to adjust a separation between the inspection modules 1.

Figure 8:
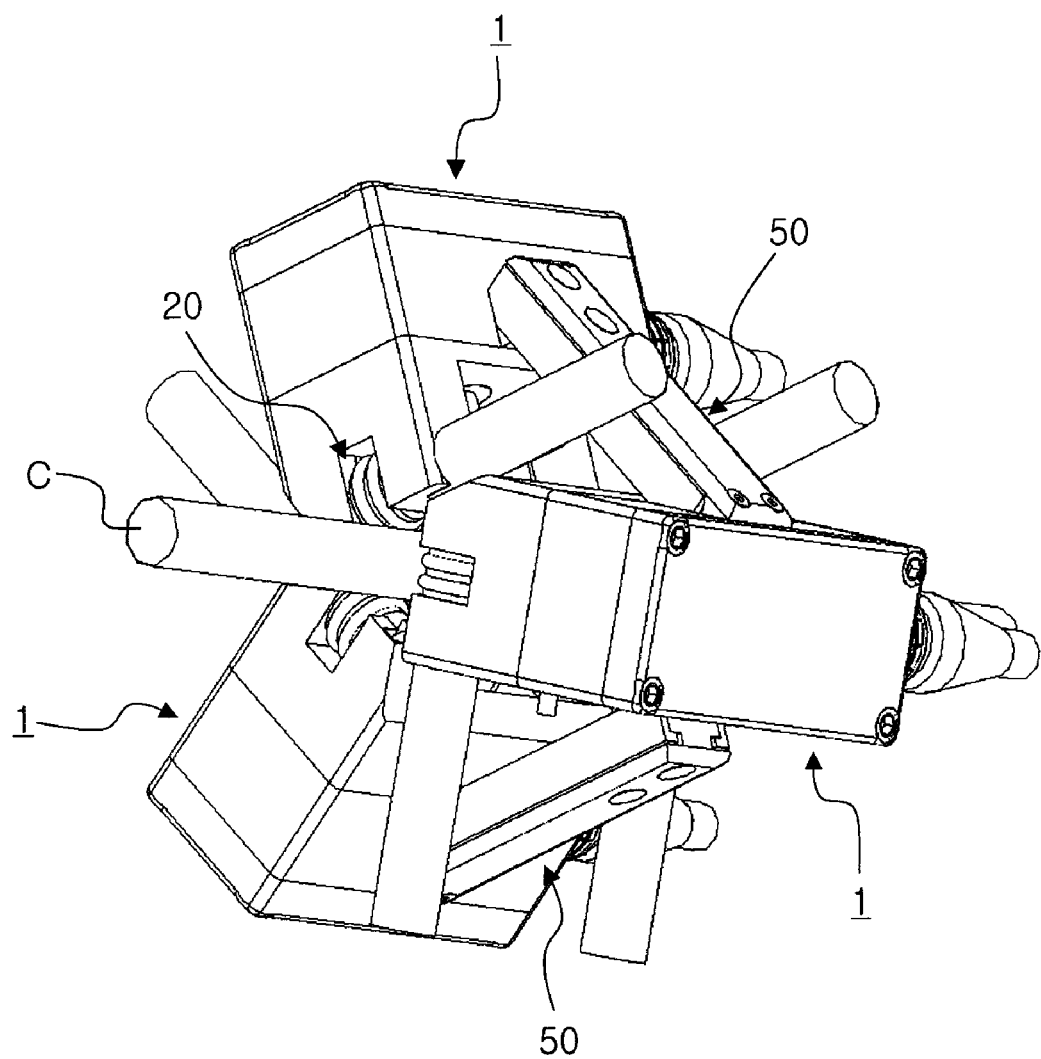
FIG. 8 shows an operation state of one example of the robot mechanism in accordance with the embodiment of the present invention.
Figure 9:
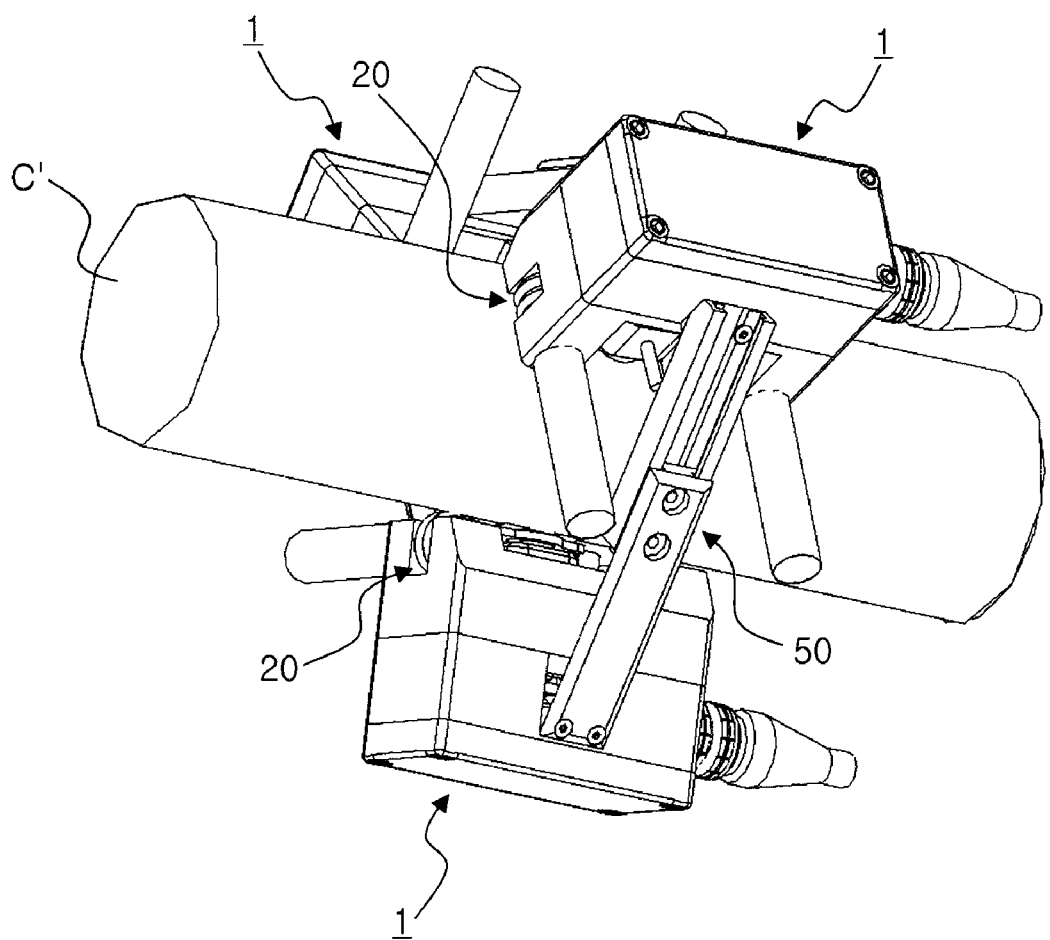
FIG. 9 shows an operation state of another example of the robot mechanism in accordance with the embodiment of the present invention.

Each of the couplers 50 includes a coupling guide member 51 that is secured at a predetermined angle to an upper portion of each of the inspection modules 1 and permits adjustment of length thereof depending on the thicknesses of cables C, C' (see FIGS. 8 and 9).

The coupling guide member 51 is mounted at an angle of 150 degrees on the upper portion of the inspection module 1 and comprises a pair of coupling guide members on right and left sides of the inspection module 1, respectively.

Each of the inspection modules 1 includes a body 10, a transfer unit 20, and a measurement unit 30.

The body 10 is divided into an upper case 60 and a lower case 70, which are coupled to each other by a fastening member.

Figure 3:
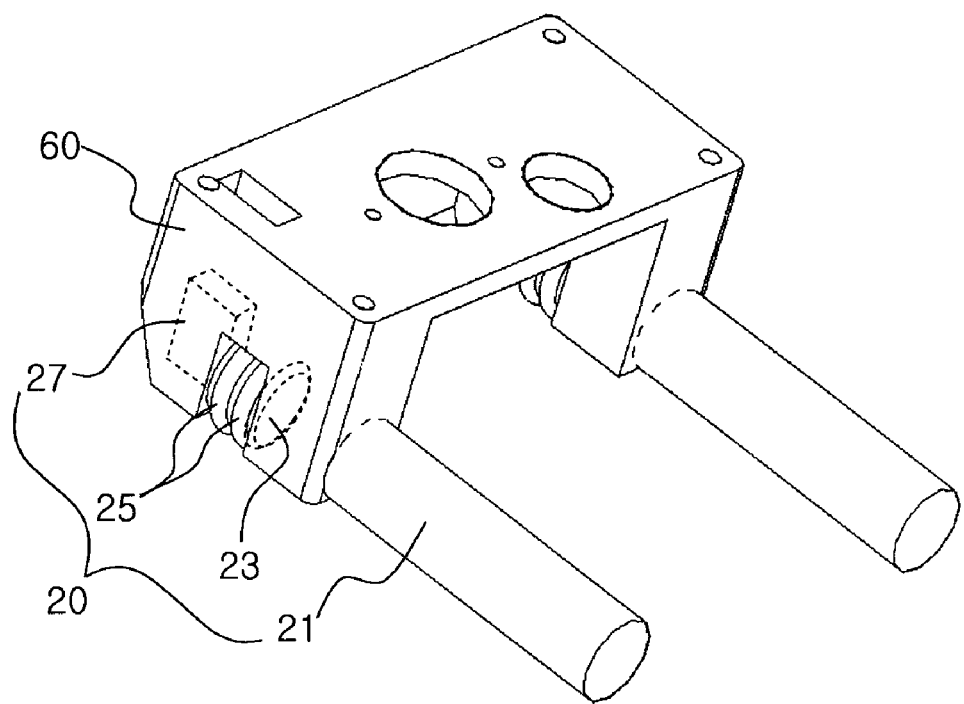
FIGS. 3 and 4 are an assembled perspective view and an exploded perspective view of a transfer unit of the robot mechanism in accordance with the embodiment of the present invention.
Figure 4:
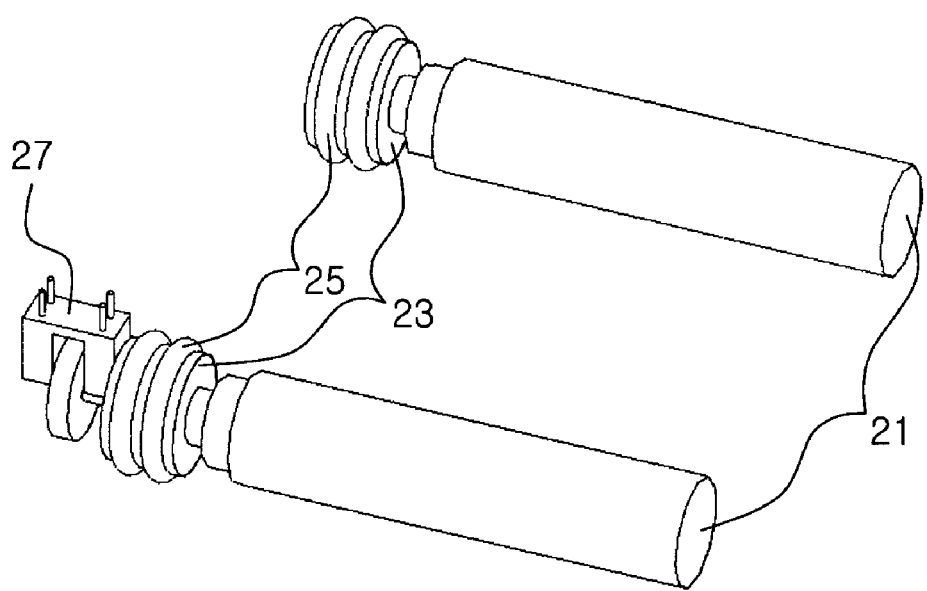

Referring to FIGS. 3 and 4, the transfer unit 20 includes a drive roller 23, a drive motor 21, and a velocity sensor 27.

The drive roller 23 is provided to a lower surface of the lower case 70 of the body 10 and comprises a pair of rollers which are disposed at right and left sides of the lower surface thereof, respectively.

The drive roller 23 is provided with a plurality of O-rings 25 on an outer periphery thereof to allow the drive roller 23 to be accurately moved on the cables C, C'.

The drive motor 21 is connected to the drive roller 23 to transmit power thereto.

The drive motor 21 is composed of a DC motor and a gear.

The velocity sensor 27 is connected to the drive roller 23 and controls the velocity of the drive roller 23, which is driven by the drive motor 21.

The velocity sensor 27 is a photo-interrupter for velocity detection. In this embodiment, an appointed location control manner using a switch is adopted to provide a simple structure to the velocity sensor notwithstanding low continuity, instead of a continuous location control manner which allows the velocity sensor to be stopped at any location by simple movement in a forward and rearward direction. As a method of controlling the velocity of the drive roller, the velocity sensor 27 employs a one-turn step control method, thereby facilitating manufacture and realization of control logic.

Figure 5:
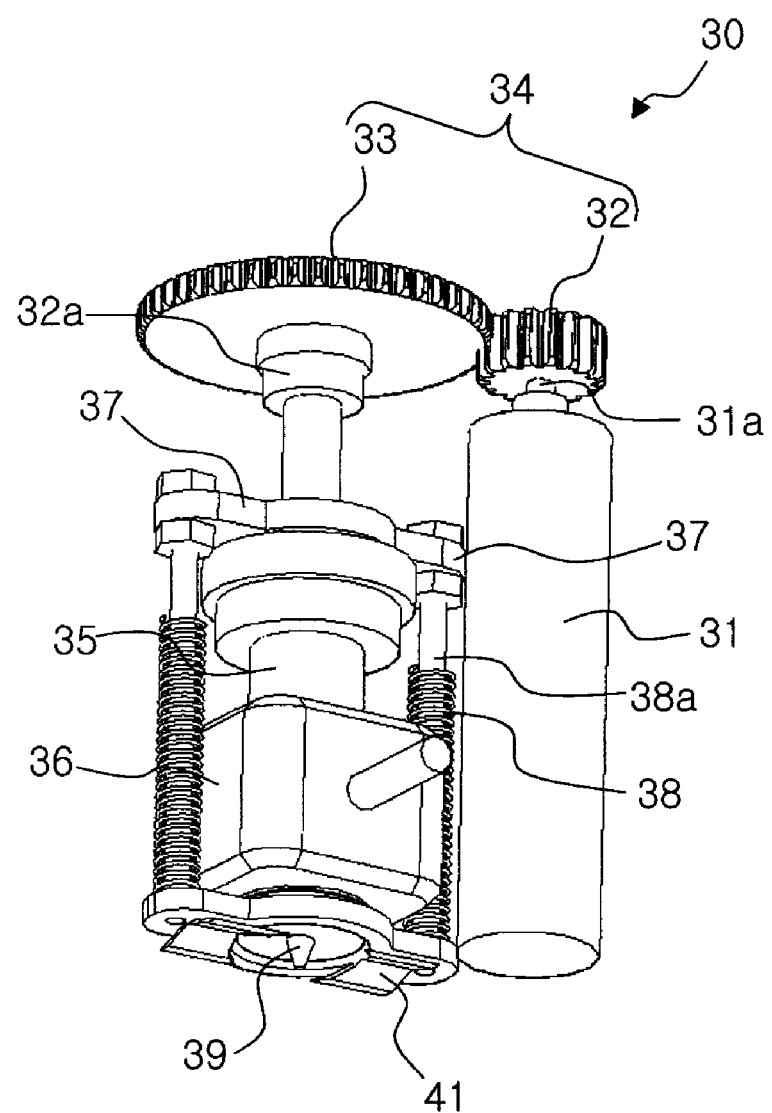
FIGS. 5 and 6 are an exploded perspective view and an assembled perspective view of a measurement unit of the robot mechanism in accordance with the embodiment of the present invention.
Figure 6:
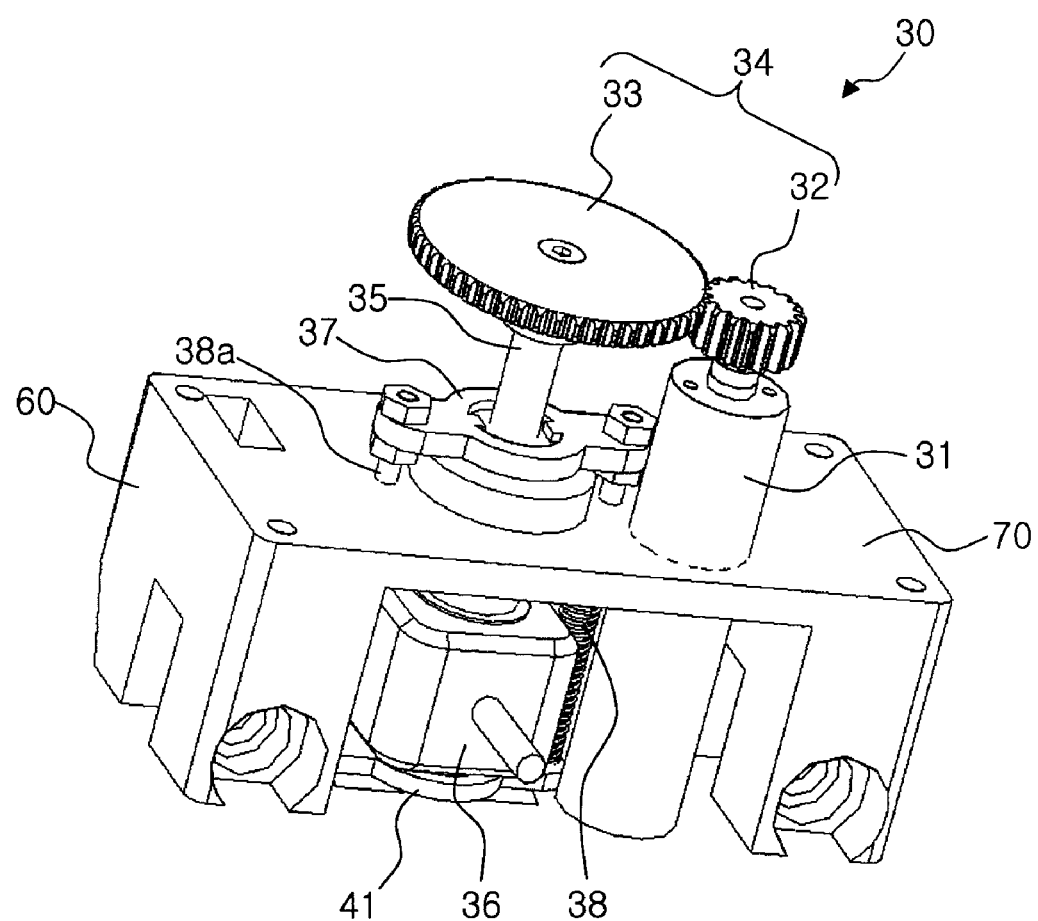

Referring to FIGS. 5 and 6, the measurement unit 30 includes a drive motor 31, a rotational shaft 31*a*, a drive gear 32, a driven gear 33, a cylinder 35, a force sensor 36, and an indentation needle 39.

The drive motor 31 is secured to the lower case 70 of the body 10.

In this embodiment, the drive motor 31 is a DC servo motor.

The rotational shaft 31*a* is connected to an upper portion of the drive motor 31 and is driven by the power transmitted from the drive motor 31.

The drive gear 32 is connected to the rotational shaft 31*a* and is associated with rotation of the rotational shaft 31*a*.

The driven gear 33 engages with the drive gear 32.

The cylinder 35 is provided to the lower surface of the driven gear 33 and converts rotation of a gear set 34 into up-down movement.

In this embodiment, the cylinder 35 has a spiral tap structure similar to a thread shape.

Figure 7:
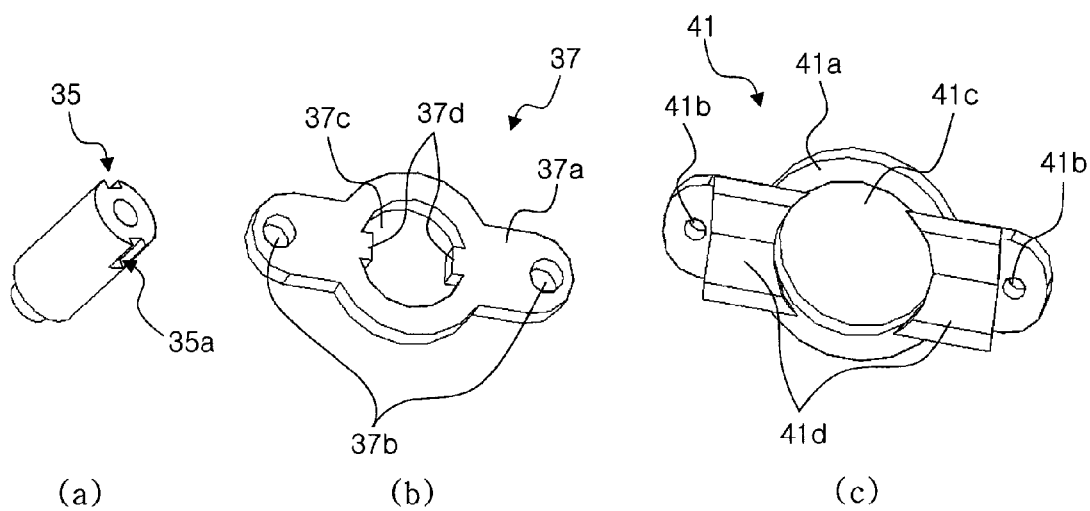
FIG. 7 is a perspective view showing main components of the robot mechanism in accordance with the embodiment of the present invention.

Referring to FIG. 7(*a*), the cylinder 35 is formed with insertion grooves 35*a* that are formed to a predetermined depth on upper right and left sides of the cylinder 35.

The force sensor 36 is provided to a lower portion of the cylinder 35 to measure or control a force generated by the cylinder 35.

As for the force sensor 36, a load cell or a thin film contact type sensor can be used. However, since the load cell is disadvantageous in view of size and weight and the thin film contact type sensor is disadvantageous in view of precision, it is desirable to use a piezoelectric force sensor which has a small size and low weight while ensuring high precision.

The indentation needle 39 is provided to a lower surface of the force sensor 36 to contact the cable C.

The cylinder 35 is provided at an upper portion thereof with a cylinder guide member 37 which guides the cylinder 35 to ensure a precise up-down movement of the cylinder 35.

Further, the force sensor 36 is provided at the lower surface thereof with a cable securing member 41 which corresponds to the cylinder guide member 37 and is secured while applying a constant pressure to the cables C, C'.

Referring to FIG. 7(*b*), the cylinder guide member 37 includes a body 37*a*, first through-holes 37*b*, a guide hole 37*c*, and stoppers 37*d*.

The first through-holes 37b comprise a pair of through-holes which are formed in right and left sides of the body 37a, respectively.

The guide hole 37c is formed in the center of the body 37a and has a larger diameter than the first through-holes 37b.

The stoppers 37d comprise a pair of stoppers which are respectively formed at right and left sides of an inner periphery of the guide hole 37c to face each other.

The stoppers 37d is fixedly inserted into the insertion holes 35a of the cylinder 35 to prevent the cylinder 35 from being rotated even when the driven gear 33 is driven by the drive gear 32, so that the cylinder 35 can be accurately guided by the cylinder guide member 37.

Referring to FIG. 7(c), the cable securing member 41 includes a body 41a, second through-holes 41b, a recess 41c, and contact portions 41d.

The second through-holes 41b comprise a pair of through-holes which are formed in right and left sides of the body 41a, respectively.

The second through-holes 41b are formed corresponding to the first through-holes 37b which are formed in the cylinder guide member 37.

The recess 41c is formed in the center of the body 41a.

The recess 41c has substantially the same diameter as that of the indentation needle 39 to guide the indentation needle 39 to precisely contact the cables C, C' when the indentation needle 39 is brought into contact with the cables C, C'.

The contact portions 41d are formed on a lower surface of the body 41a and directly contact the cables C, C' to be secured while applying a constant pressure to the cables C, C'.

On the other hand, the measurement unit 30 further includes elastic members 38 disposed between the cylinder guide member 37 and the cable securing member 41, and elastic member-guide members 38a disposed between the first through-holes 37b of the cylinder guide member 37 and the second through-holes 41b of the cable securing member 41 to guide the elastic members 38, respectively.

In this embodiment, at least two inspection modules 1 having the configuration as described above are arranged at an interval of 120 degrees and simultaneously operated.

One example of the robot mechanism according to the invention will be described with reference to FIG. 8.

In this example, the robot mechanism includes at least two inspection modules 1 arranged at an interval of 120 degrees. With the inspection modules 1 installed around a cable C, the coupling guide members 51 of the couplers 50 are slid corresponding to the size of the cable C.

After the coupling guide members 51 are slid, the drive motor 31 of each of the measurement units 30 secured to the lower portion of the body 10 receives measured valves. Here, as the rotational shaft 31a connected to the drive motor 31 and the drive gear 32 connected to the rotational shaft 31a are rotated in the "①" direction, the driven gear 33 engaging with the drive gear 32 is rotated in the "②" direction.

Then, the cylinder 35 performs up-down movement along the spiral tap formed therein, and the cable securing member 41 provided to the lower portion of the cylinder 35 is operated in the "③" direction by rigidity of the elastic members disposed between the cylinder guide member 37 and the cable securing member 41 to force the contact portions 41d of the cable securing member 41 to be secured to an upper portion of an outer peripheral surface of the cable C. Further, the indentation needle 39 is lowered and press-fitted into the recess 41c of the cable securing member 41 to detect a degree of aging of the cable C.

Here, since the degree of aging can vary depending on the location of the cable C, the robot mechanism is designed to allow the transfer units 20 and the measurement units 30 of the at least two inspection modules 1 to be simultaneously operated for measurement of the degree of aging of the cable.

When measuring the degree of aging, a measurement signal is transmitted from the force sensor 36 to a computer through a controller and used to control an indentation testing mechanism.

When the measurement is finished, the couplers 50 of the inspection modules 1 are slid in the opposite direction to the initial direction in which the couplers 50 are moved for measurement of the aging degree. Then, the elastic members 38 are raised by the elastic member guide member 38a and the cable securing member 41 secured to the cable C is automatically raised and separated from the cable C, thereby completing the measurement.

Another example of the robot mechanism according to the invention will be described with reference to FIG. 9.

When evaluating a cable C' having a different size from that of the cable C, the coupling guide member 51 of the coupler 50 in each of the inspection modules 1 is slid to correspond to the size of the cable C'.

The sequence after sliding of the coupling guide member 51 is the same as the above example.

As such, the robot mechanism according to this invention measures a force per unit area to evaluate the aged state of a cable.

Therefore, the measurement unit is designed to measure the force exerted on the indentation needle and the indentation depth corresponding to the force.

Further, since the degree of aging can vary depending on the location of the cable, the robot mechanism is configured to simultaneously measure a plurality of points on the cable and to automatically measure various portions of the cable.

Since the indentation distance must be measurable and the robot mechanism must be controlled at a predetermined velocity, the robot mechanism includes an encoder and a Proportional Integral Derivative (PID) controller.

The robot mechanism according to this invention allows all operations to be automatically performed to reduce the number of workers and operation time. Further, the cable securing member used for securing a cable unfolds a bent portion of the cable and minimizes measurement errors, which can occur due to a space (where an inner filing material is not present) in a cable jacket and due to an unsmooth surface of the cable, thereby providing the same measurement result even after repetitious testing.

Although some embodiments have been provided to illustrate the invention in conjunction with the drawings, it will be apparent to those skilled in the art that the embodiments are given by way of illustration only, and that various modifications, changes, and substitutions can be made without departing from the spirit and scope of the invention. The scope of the invention should be limited only by the accompanying claims and equivalents thereof.

What is claimed is:

1. A robot mechanism for nondestructive aging evaluation of a cable, comprising:
   at least two inspection modules, each approaching a cable and automatically inspecting an aged state of the cable, wherein each of the inspection modules includes:
   a body assembled by a fastener;
   a transfer unit coupled to a lower portion of the body and moving along the cable; and
   a measurement unit disposed at a center of the lower portion of the body to perform measurement and inspection of a local aged state of the cable, wherein the measurement unit includes:

a drive motor secured to the lower portion of the body;

a rotational shaft connected to an upper portion of the drive motor and driven by transmitted power;

a drive gear connected to the rotational shaft to be associated with rotation of the rotational shaft;

a driven gear engaging with the drive gear;

a cylinder converting the rotation of the rotational shaft into up-down movement;

a force sensor provided to a lower portion of the cylinder to measure or control a force generated by the cylinder; and an indentation needle provided to a lower surface of the force sensor to contact the cable; and a coupler disposed between the at least two inspection modules and connected to each of the inspection modules to adjust a separation between the inspection modules.

2. The robot mechanism according to claim 1, wherein the transfer unit comprises a pair of drive rollers provided to a lower surface of the body to move along an upper surface of the cable, a drive motor connected to the drive rollers to transmit power, and a detection sensor detecting a velocity of the drive rollers to control the drive rollers.

3. The robot mechanism according to claim 2, wherein each of the drive rollers is provided with a plurality of O-rings.

4. The robot mechanism according to claim 2, wherein the detection sensor comprises a photo-interrupter for velocity detection and employs a one-turn step control method.

5. The robot mechanism according to claim 1, wherein the measurement unit further comprises a cylinder guide member disposed at an upper portion of the cylinder to guide the cylinder during the up-down movement of the cylinder.

6. The robot mechanism according to claim 1, wherein the cylinder guide member comprises:
a body;
a pair of through-holes formed in right and left sides of the body, respectively; a guide hole formed in a center of the body; and
a pair of stoppers formed on left and right walls of the guide hole facing each other.

7. The robot mechanism according to claim 1, wherein the cylinder is formed at right and left sides thereof with insertion grooves corresponding to the stoppers.

8. The robot mechanism according to claim 1, wherein the force sensor is provided at the lower surface thereof with a cable securing member corresponding to the cylinder guide member and secured to the cable by a constant pressure.

9. The robot mechanism according to claim 8, wherein the cable securing member comprises:
a body;
a pair of through-holes formed in right and left sides of the body, respectively;
a recess formed in a center of the body; and
a pair of contacts formed on a lower surface of the body and directly secured to an outer surface of the cable.

10. The robot mechanism according to claim 5 or 8, wherein the measurement unit further comprises:
an elastic member between the cylinder guide member and the cable securing member; and
an elastic member-guide member integrally formed with the cylinder guide member between the cylinder guide member and the cable securing member to guide the elastic member while allowing up-down movement of the cable securing member.

11. The robot mechanism according to claim 1, wherein the coupler is secured at a predetermined angle to one side of an upper portion of the body and is provided with a coupling guide member which allows adjustment of length thereof depending on a thickness of the cable.

12. The robot mechanism according to claim 11, wherein the coupling guide member is mounted at 150 degrees relative to the cable.

13. The robot mechanism according to claim 1, wherein the transfer units, the measurement units and the couplers adjusting the separation between the inspection modules are arranged at a predetermined angle with respect to each other and are simultaneously driven.

* * * * *